United States Patent [19]

Wise

[11] Patent Number: 4,546,335
[45] Date of Patent: Oct. 8, 1985

[54] MANUAL REMOTE SOUND CONTROL FOR TV AND RADIO AND HIGH FIDELITY

[76] Inventor: Lawrence Wise, 4330 Hillcrest Dr., Apt. 804, Hollywood, Fla. 33021

[21] Appl. No.: 539,267

[22] Filed: Oct. 5, 1983

[51] Int. Cl.⁴ .......................... H03J 9/00; H04B 1/06; H04N 5/44
[52] U.S. Cl. ..................................... 334/8; 74/10 A; 358/194.1; 455/354
[58] Field of Search .................... 334/8, 89; 74/10 A; 455/151, 352, 354; 358/194.1; 464/182; 57/217, 221, 223, 232, 250; 87/1

[56] References Cited

U.S. PATENT DOCUMENTS

| | | | |
|---|---|---|---|
| 1,980,172 | 11/1934 | Ball | 334/8 X |
| 2,036,948 | 4/1936 | McNary | 334/8 X |
| 2,042,824 | 6/1936 | Brazier et al. | 57/232 X |
| 2,917,891 | 12/1959 | Murdock | 57/250 X |
| 4,392,256 | 7/1983 | Russell | 455/354 |

Primary Examiner—Paul Gensler
Attorney, Agent, or Firm—Oltman and Flynn

[57] ABSTRACT

A braided cord and a connector are provided for remote control of a rotary knob.

3 Claims, 3 Drawing Figures

MANUAL REMOTE SOUND CONTROL FOR TV AND RADIO AND HIGH FIDELITY

BACKGROUND OF THE INVENTION

Most TV sets and Radios and High Fidelity equipment presently in use throughout the world are equipped with turning knobs to provide for the listener/viewer means of switching on and off and increasing and decreasing the volume of sound emanating from the unit. Also through the same type of turning knobs, the listener/viewer is able to change channels on TV and tune in and out different radio stations at will. My present invention is useful on all TV, High Fidelity and Radio sets which are equipped with standard rotation knobs. Other types of TV, High Fidelity and Radio sets are equipped with push button on and off switching devices, for which my invention cannot be used.

At the present time, remote control devices are electronic in design and costly, and require special electronic hook-ups with the set in order to operate. These expensive electronic remote control devices are usually purchased at the point and time of sale, and are not available without great cost to the listener/viewer after the set has been installed in the home. My invention is not electronic.

My present invention as will be noted in the attached drawings is most simple in design, extremely low in cost to manufacture and ideally suited for efficient remote control by the listener/viewer of any TV or Radio set with rotational type switching knobs as mentioned above.

DESCRIPTION

My invention consists of an ordinary length of braided cord 10, 10a, such as is used in a clothes line which cord is stiffened by running the cord through a stiffening material such as melted wax or paraffin. The purpose of the waxing operation is to add reasonable stiffness to the cord which will permit the cord to remain flexible and at the same time maintain an extremely high amount of torque along the full length of the cord.

When one end of the cord is fitted with a suitable connector 12, the knot 14 of the cord may be easily and firmly attached to the connector.

Figure 1:
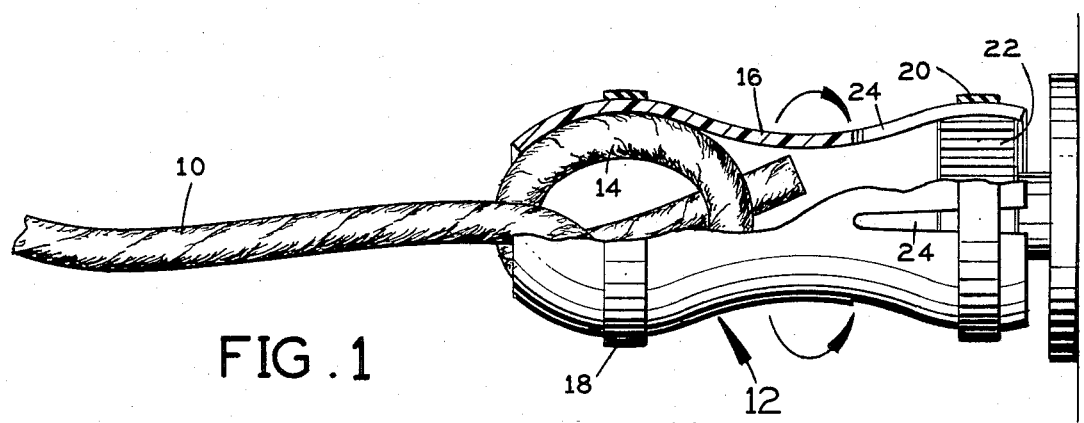
FIG. 1 is an elevational view showing a braided cord and a connector in accordance with a preferred embodiment of the invention, the connector being attached to a rotary knob.
Figure 2:
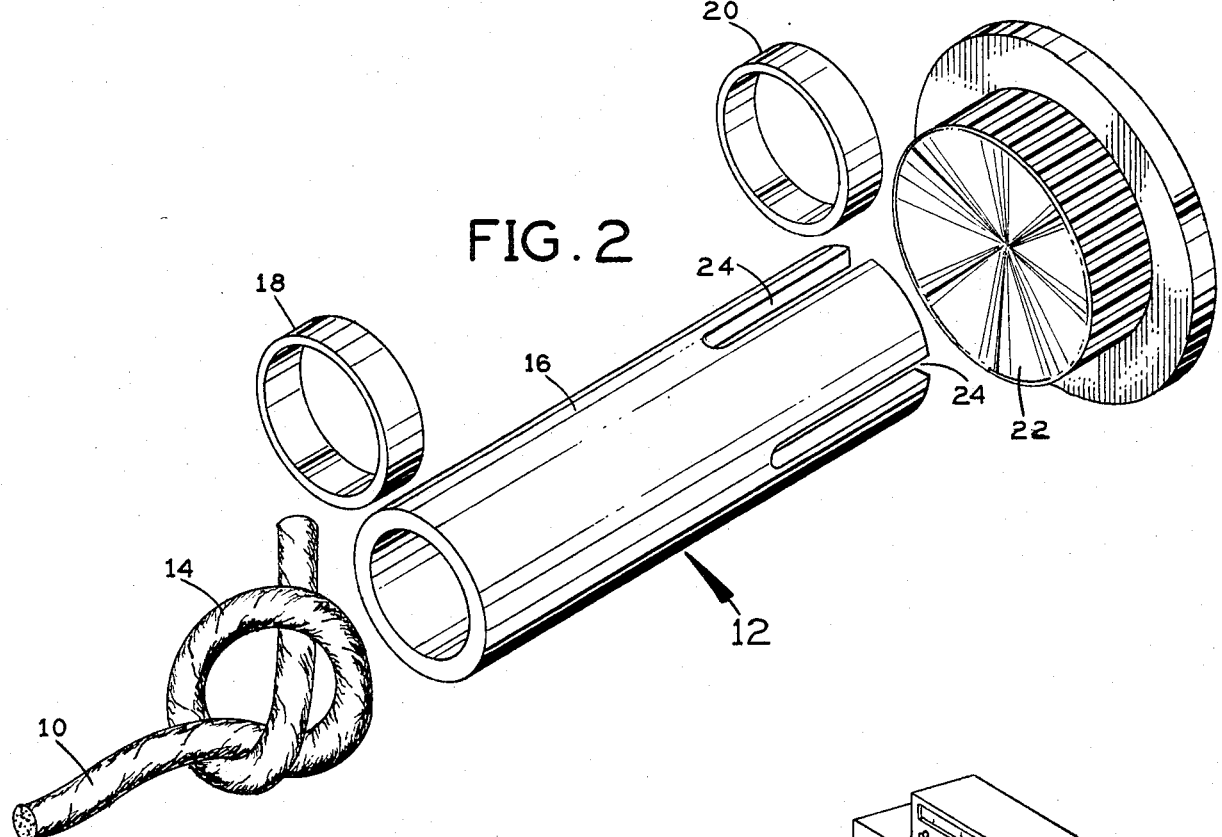
FIG. 2 is an exploded view of the cord and connector.
Figure 3:
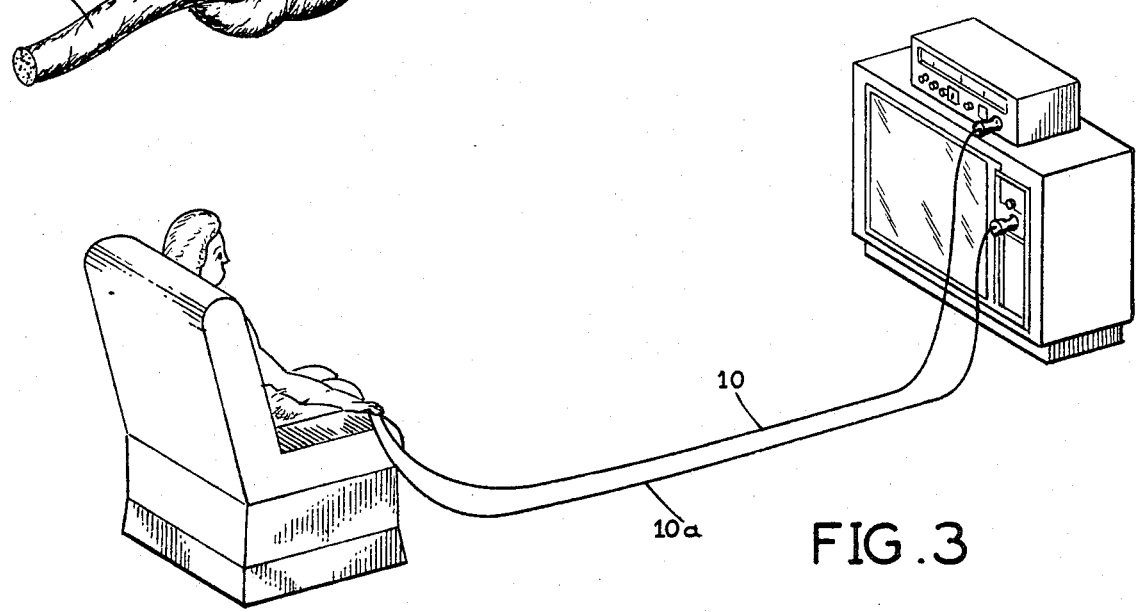
FIG. 3 is a perspective view showing two of my devices in use by a listener and connected to a high fidelity set and a television set.

The listener/viewer can sit at a normally desired distance from the TV, High Fidelity set or Radio, and by holding the cord between the thumb and forefingers, can instantly rotate the knob of the set to which the cord is attached, in order to decrease or increase the volume of sound, or switch the set on or off or change TV channels or radio stations, depending upon which knob is being rotated, as shown in FIG. 3.

The braided cord is chosen rather than other means, such as: rigid or semi-rigid plastic, metal or woodrod or other obvious materials because it is the most practical and low cost material to give maximum efficiency in operation.

Another feature of the braided cord is the ease with which it may be rolled up and neatly set near the TV, High Fidelity or Radio and be ready for use whenever the set is operating. It is obvious that various types of clamps, clips, or other connector devices can be used to attach the cord to the TV or Radio knob. My illustrations show one means which I have found to be most practical, low cost and efficient. It comprises a 2" length of semi-soft plastic or rubber tubing 16 with rubber bands 18 and 20 to create the pressure to hold the cord and to hold the knob 22. This connector provides a safe way to be able to use the remote control cord without straining or damaging the sensitive switch device of the set. The remote control cord can be attached and preferably remain connected to the knob of the Radio, High Fidelity or TV set permanently. The tubing is slit as illustrated at 24 to permit pressure fit of various diameters of standard TV/Radio knobs. The cord can be of color that fits the average decor of furniture, such as brown.

A small box-like container (not shown) can be used to hold the wound-up cord neatly when the set is not in use. The container is approximately 5" square by 1½" deep and can be made of cardboard, plastic or other material can be used as a package for the sale and distribution of the device.

The remote control cord described above can be sold to all those presently owning a TV, High Fidelity or radio set or can be supplied by the manufacturer when the TV, High Fidelity or Radio is sold in the store.

I claim:

1. A remote manual control for a continuous rotary knob for volume control or continuous tuning of a television, radio or high fidelity set or the like comprising:
   a braided flexible cord stiffened with a stiffening substance; and
   a flexible tube attached to one end of said cord for connecting said cord to said knob and for permitting said cord to be turned to rotate said knob, said cord having a knot received in said tube.

2. A remote manual control as claimed in claim 1 wherein the stiffening substance is paraffin.

3. A remote manual control as claimed in claim 1, wherein the stiffening substance is wax.

* * * * *